(12) United States Patent
Toyao et al.

(10) Patent No.: US 8,922,455 B2
(45) Date of Patent: Dec. 30, 2014

(54) STRUCTURE

(75) Inventors: Hiroshi Toyao, Tokyo (JP); Noriaki Ando, Tokyo (JP)

(73) Assignee: NEC Corporation, Toyko (JP)

( * ) Notice: Subject to any disclaimer, the term of this patent is extended or adjusted under 35 U.S.C. 154(b) by 198 days.

(21) Appl. No.: 13/700,960

(22) PCT Filed: Jun. 2, 2011

(86) PCT No.: PCT/JP2011/003110
§ 371 (c)(1),
(2), (4) Date: Nov. 29, 2012

(87) PCT Pub. No.: WO2011/152055
PCT Pub. Date: Dec. 8, 2011

(65) Prior Publication Data
US 2013/0069848 A1  Mar. 21, 2013

(30) Foreign Application Priority Data
Jun. 2, 2010  (JP) .................................. 2010-127199

(51) Int. Cl.
| H01Q 1/00 | (2006.01) |
| H01Q 15/02 | (2006.01) |
| H05K 1/02 | (2006.01) |
| H01Q 13/28 | (2006.01) |
| H05K 1/16 | (2006.01) |

(52) U.S. Cl.
CPC ........ H01Q 13/28 (2013.01); H05K 2201/0141 (2013.01); H05K 1/0236 (2013.01); H05K 1/024 (2013.01); H05K 1/165 (2013.01)
USPC .... 343/904; 343/905; 343/909; 343/700 MS; 343/907

(58) Field of Classification Search
None
See application file for complete search history.

(56) References Cited

U.S. PATENT DOCUMENTS

| 6,917,343 | B2 * | 7/2005 | Sanchez et al. ............... 343/795 |
| 2009/0278744 | A1 * | 11/2009 | Kirino et al. ........... 343/700 MS |
| 2011/0134010 | A1 * | 6/2011 | Toyao et al. ................... 343/844 |
| 2012/0007786 | A1 * | 1/2012 | Ando et al. ................... 343/749 |
| 2012/0032865 | A1 * | 2/2012 | Toyao et al. ................... 343/835 |
| 2014/0210672 | A1 * | 7/2014 | Chiu et al. ............. 343/700 MS |

FOREIGN PATENT DOCUMENTS

| JP | 2006-211328 A | 8/2006 |
| JP | 2007-088883 A | 4/2007 |
| WO | 2010/013496 A1 | 2/2010 |

* cited by examiner

Primary Examiner — Trinh Dinh
(74) Attorney, Agent, or Firm — Sughrue Mion, PLLC

(57) ABSTRACT

A plurality of second conductors (200) are opposite to a first conductor (100), and are repeatedly, for example, periodically arranged. Third conductors (410) are provided at a position opposite to each of the plurality of second conductors (200). A variable dielectric constant layer is formed of a variable dielectric constant material of which the dielectric constant varies with a voltage, for example, a liquid crystal, and is provided at least one of between the plurality of second conductors (200) and the plurality of third conductors (410) and between the plurality of second conductors (200) and the first conductor (100). A fourth conductor (300) is connected to a first one of the second conductors (200) and a second one of the second conductors (200) located next thereto through a via (500). The fourth conductor (300) is opposite to the second conductor (200), and thus forms a transmission line using the second conductor (200) as a return path.

18 Claims, 19 Drawing Sheets

STRUCTURE

CROSS REFERENCE TO RELATED APPLICATIONS

This application is a National Stage of International Application No. PCT/JP2011/003110 filed Jun. 2, 2011, claiming priority based on Japanese Patent Application No. 2010-127199 filed Jun. 2, 2010, the contents of all of which are incorporated herein by reference in their entirety.

TECHNICAL FIELD

The present invention relates to a structure indicating the characteristics of a metamaterial.

BACKGROUND ART

In recent years, it has been obvious that the propagation characteristics of electromagnetic waves are able to be controlled by periodically arranging conductor patterns having a specific structure (hereinafter, called a metamaterial). For example, a reduction in size and thickness of an antenna can be achieved by using a metamaterial.

There are a so-called right-handed system, left-handed system, and right-handed and left-handed composite system in metamaterials. Patent Document 1 discloses a technique in which among the systems, a metamaterial of the right-handed and left-handed composite system is used as an array antenna (leaky wave antenna). This technique is used to arrange a liquid crystal layer between two conductors constituting a capacitive component of a unit cell of a metamaterial. It discloses that since a variation in a voltage applied between the two conductors gives rise to a change in the dielectric constant of the liquid crystal layer, the directionality of electromagnetic waves changes as a result.

RELATED DOCUMENT

Patent Document

[Patent Document 1] Japanese Unexamined Patent Publication No. 2006-211328

DISCLOSURE OF THE INVENTION

In the technique disclosed in Patent Document 1, an interconnect for applying a voltage is required to be connected to each of the two conductors. On the other hand, the metamaterial is formed by repeatedly arranging unit cells. For this reason, in the technique disclosed in Patent Document 1, interconnects have to be connected to each of the two conductors in the respective plurality of unit cells. For this reason, an interconnect structure for applying a voltage becomes complicated.

An object of the invention is to provide a structure, having a simple interconnect structure, which is capable of easily varying the directionality of leaky waves.

According to the present invention, there is provided a structure including: a first conductor; a plurality of second conductors, opposite to the first conductor, which are repeatedly arranged; a plurality of third conductors opposite to the respective plurality of second conductors; a variable dielectric constant layer, provided at least one of between the plurality of third conductors and the plurality of second conductors and between the plurality of third conductors and the first conductor, of which a dielectric constant varies with a voltage; and a fourth conductor that connects a first one of the second conductors and a second one of the second conductors located next to the first one of the second conductors to each other.

According to the invention, it is possible to provide a structure, having a simple interconnect structure, which is capable of easily varying the directionality of leaky waves.

BRIEF DESCRIPTION OF THE DRAWINGS

The above-mentioned objects, other objects, features and advantages will be more apparent from preferred embodiments described below, and the following accompanying drawings.

DESCRIPTION OF EMBODIMENTS

Figure 1:
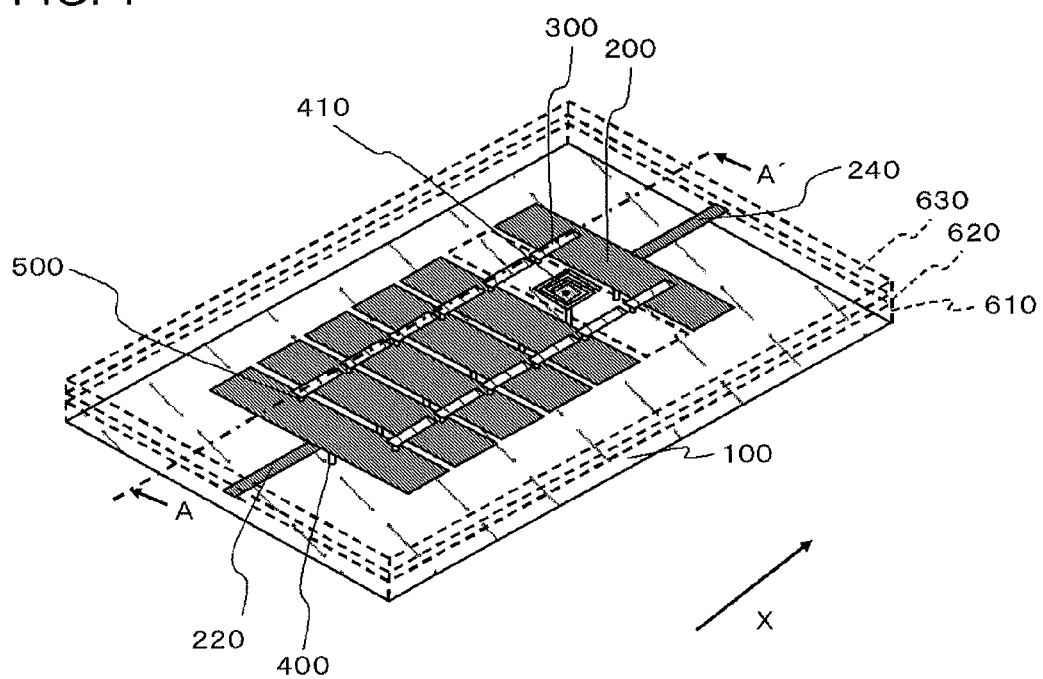
FIG. 1 is a perspective view illustrating a configuration of a structure according to a first embodiment.

Hereinafter, embodiments of the invention will be described with reference to the accompanying drawings. In all the drawings, like elements are referenced by like reference numerals and descriptions thereof will not be repeated.

Figure 2:
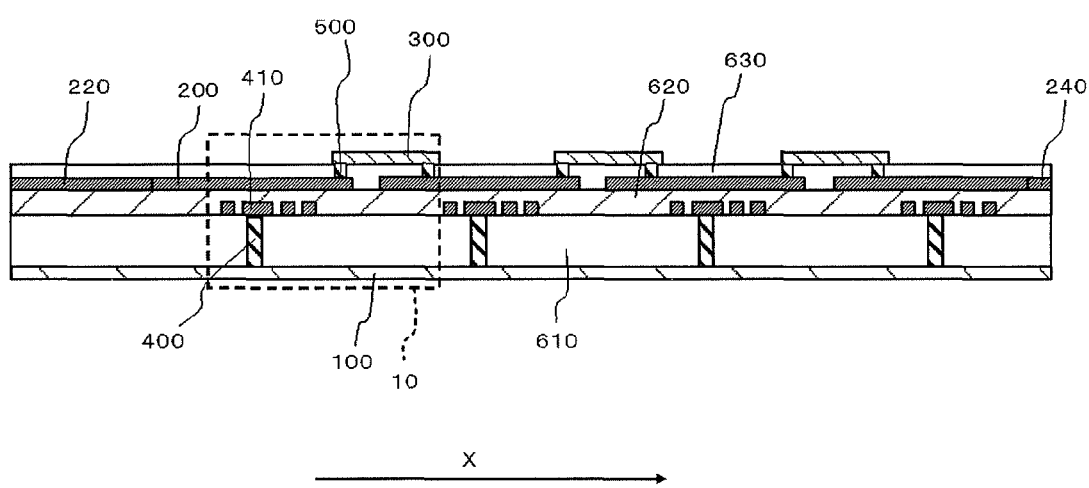
FIG. 2 is a sectional view taken along the line A-A' of FIG. 1.

FIG. 1 is a perspective view illustrating a configuration of a structure according to a first embodiment, and FIG. 2 is a sectional view taken along the line A-A' of FIG. 1. Meanwhile, in FIG. 2, power feed conductors 220 and 240 and vias 400 described later are shown for convenience of description. This structure includes a first conductor 100, a plurality of second conductors 200, a plurality of third conductors 410, a variable dielectric constant layer (insulating layer 620), and a fourth conductor 300. The plurality of second conductors 200 are opposite to the first conductor 100, and are repeatedly, for example, periodically arranged. The third conductors 410 are provided at a position opposite to each of the plurality of second conductors 200. The variable dielectric constant layer is formed of a variable dielectric constant material of which the dielectric constant varies with a voltage, for example, a liquid crystal, and is provided at least one of between the plurality of second conductors 200 and the plurality of third conductors 410 and between the plurality of third conductors 410 and the first conductor 100. In the embodiment, the variable dielectric constant layer is the insulating layer 620, and is located between the second conductors 200 and the third conductors 410. The fourth conductor 300 is connected to each of a first one of the second conductors 200 and a second one of the second conductors 200 located next thereto through a via 500. The fourth conductor 300 is opposite to the second conductors 200, to thereby form a transmission line using the second conductors 200 as a return path. Hereinafter, a description will be made in detail.

The first conductor 100 is, for example, a metal film such as a Cu film, and extends in a sheet shape in a first conductor layer. An insulating layer 610 is provided on the first conductor 100. A second conductor layer is formed on the insulating layer 610. The third conductors 410 are formed on the second conductor layer. The insulating layer 620 is formed on the second conductor layer. A third conductor layer is formed on the insulating layer 620. The second conductors 200 are formed on the third conductor layer. An insulating layer 630 is formed on the third conductor layer. A fourth conductor layer is formed on the insulating layer 630. The fourth conductor 300 is formed on the fourth conductor layer. That is, in the embodiment, the second conductors 200 are located at the opposite side to the first conductor 100 through the third conductors 410, and the fourth conductor 300 is located at the opposite side to the third conductors 410 through the second conductors 200. The second conductors 200, the third conductors 410, and the fourth conductor 300 are, for example, metal films such as a Cu film, and are repeatedly, for example, periodically provided along a first direction (X direction in the drawing).

As mentioned above, the fourth conductor 300 is configured such that one end thereof is electrically connected to the first one of the second conductors 200, and the other end thereof is connected to the second one of the second conductors 200. For this reason, the fourth conductor 300 forms a microstrip line using the second one of the second conductors 200 as a return path, and functions as a short stub. In the embodiment, three or more second conductors 200 are provided, and the fourth conductor 300 is provided between at least a set of second conductors 200 located next to each other. In the example shown in FIGS. 1 and 2, the fourth conductor 300 is provided between all the second conductors 200 located next to each other. The plurality of second conductors 200 are connected to each other through the fourth conductor 300 and the via 500 in a direct-current manner.

The via 500 passes through the insulating layer 630, and is configured such that one end thereof is connected to the second conductor 200, and the other end thereof is connected to the end of the fourth conductor 300. In FIG. 2, the via 500 is connected to the second conductor 200 at the end of the second conductor 200, that is, a place which does not overlap the via 400 described later, in the X direction in the drawing.

The third conductor 410 is an interconnect-shaped conductor pattern. The third conductor 410 is configured such that one end thereof is connected to the other end of the via 400, and the other end thereof is an open end. The third conductor 410 forms a microstrip line using the second conductor 200 as a return path, and functions as an open stub. In the embodiment, the third conductor 410 is connected to the first conductor 100 through the via 400 passing through the insulating layer 610.

Meanwhile, as shown in FIG. 1, in the embodiment, two fourth conductors 300 are formed with respect to one second conductor 200, but the number of fourth conductors 300 is not limited thereto. In addition, the fourth conductor 300 is, for example, a conductor pattern extending linearly, but is not limited thereto.

In addition, the power feed conductors 220 and 240 are formed on the third conductor layer, that is, on the same layer as the second conductors 200. The power feed conductor 220 is electrically connected to the second conductor 200 located at one end of the array of the second conductors 200, and the power feed conductor 240 is electrically connected to the second conductor 200 located at the other end of the array of the second conductors 200. The power feed conductors 220 and 240 may be directly connected to the second conductors 200, and may be capacitively coupled thereto. The power feed conductors 220 and 240 are opposite to the first conductor 100, and thus form a power feed conductor line together with the first conductor 100. The structure according to the embodiment functions as an array antenna (leaky wave antenna). However, the power feed conductors 220 and 240 are not necessarily required to be provided to both ends of the array of the second conductors 200, but may be provided to any one end.

In the structure according to the embodiment, a unit cell 10 is repeatedly, for example, periodically arranged. The unit cell 10 includes the first conductor 100, the via 400, the third conductor 410, half of the first one of the second conductors 200, half of the second one of the second conductors 200, the via 500, and the fourth conductor 300. The unit cells 10 are repeatedly arranged, and thus portions other than the power feed conductor lines 220 and 240 of the structure function as a metamaterial.

Herein, when the "repeated" unit cells 10 are arranged, it is preferable that the gap (center-to-center distance) between the same vias is within ½ of wavelength λ of electromagnetic waves assumed as noise, in the unit cells 10 located next to each other. In addition "repeated" also includes a case where a portion of the configuration is missing in any of the unit cells 10. In addition, when the unit cells 10 have a two-dimensional array, "repeated" also includes a case where the unit cells 10 are partially missing. In addition, "periodic" also includes a case where a portion of the components is out of alignment in some unit cells 10, or a case where the arrangement of some unit cells 10 themselves is out of alignment. That is, even when periodicity in a strict sense collapses, the characteristics as a metamaterial can be obtained when the unit cells 10 are repeatedly arranged, and thus some degree of defects are allowed in the "periodicity". Meanwhile, it is considered that factors for which these defects are generated include a case of passing the interconnects or the vias between the unit cells 10, a case where the unit cells 10 cannot be arranged due to the existing vias or patterns, when a metamaterial structure is added to the existing interconnect layout, manufacturing errors, a case where the existing vias or patterns are used as a portion of the unit cell 10, and the like.

Figure 3:
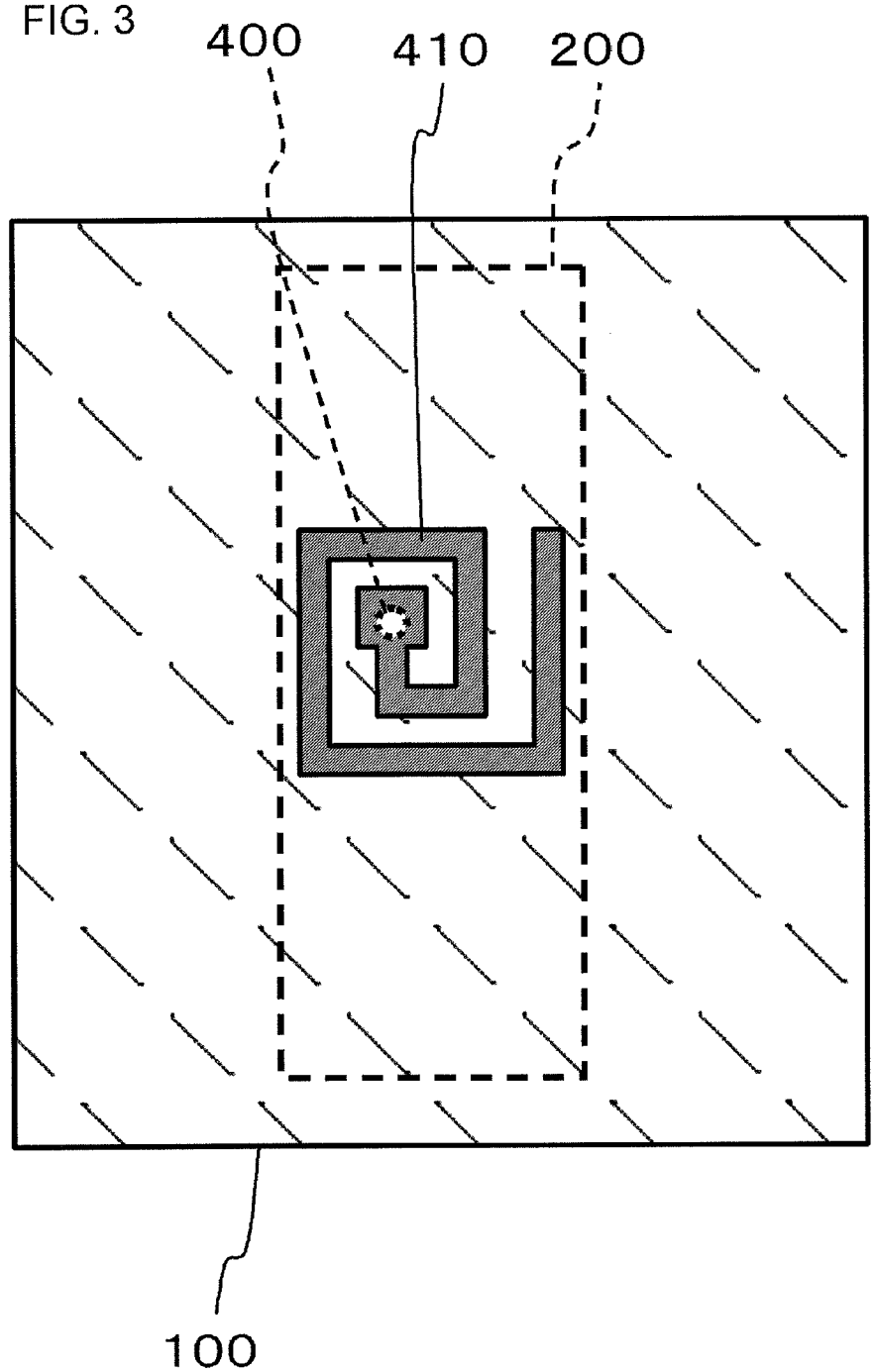
FIG. 3 is a plan view illustrating a pattern of a third conductor.

FIG. 3 is a plan view illustrating a pattern of the third conductor 410. In the example shown in the drawing, the third conductor 410 extends in a spiral shape. In the third conductor 410, the end located at the spiral center is connected to the via 400. The entirety of the spiral formed by the third conductor 410 is opposite to the second conductor 200.

Figure 4:
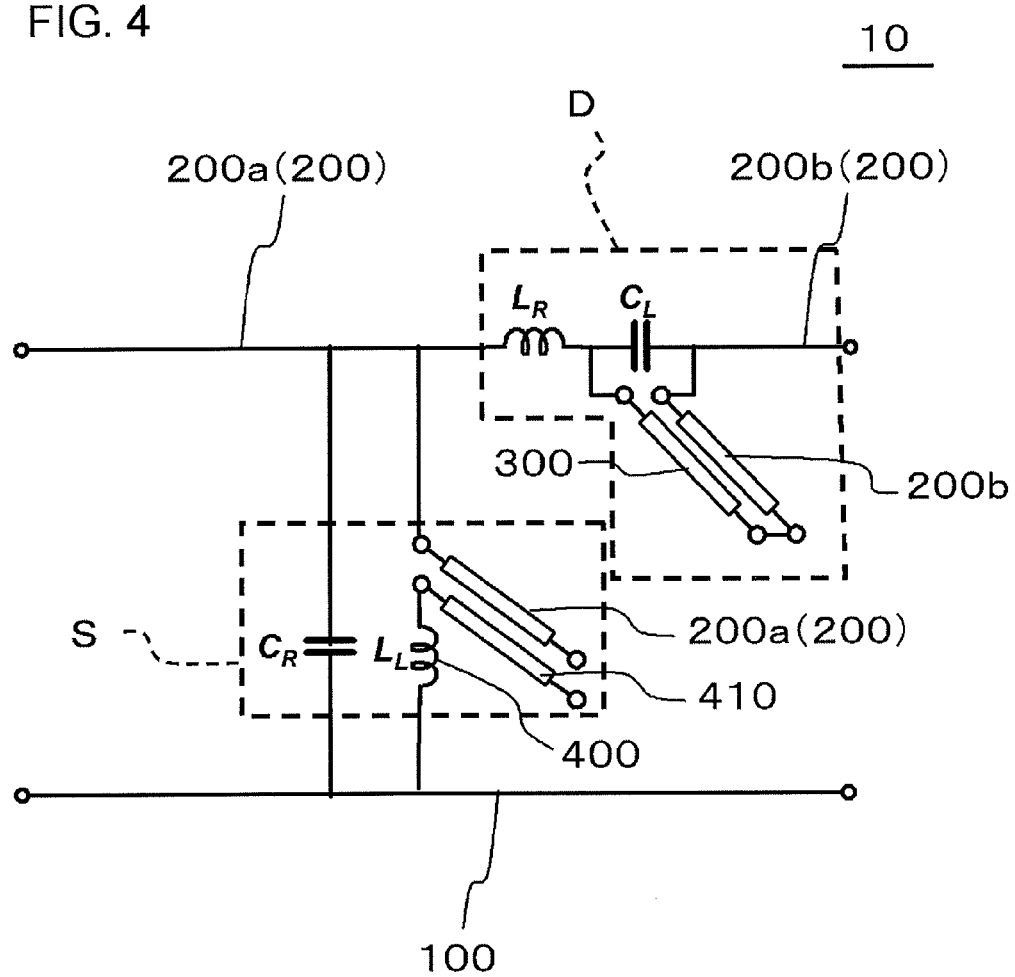
FIG. 4 is an equivalent circuit diagram of a unit cell shown in FIG. 2.

FIG. 4 is an equivalent circuit diagram of the unit cell 10 shown in FIG. 2. The first conductor 100 and the second conductor 200 are opposite to each other, and thus a capacitance $C_R$ is formed therebetween. In addition, the third conductor 410 is located between the first conductor 100 and the second conductor 200. The third conductor 410 forms an open stub together with the second conductor 200. In addition, the third conductor 410 is connected to the first conductor 100 through the via 400, and thus an inductance $L_L$ caused by the via 400 is formed between the first conductor 100 and the open stub. In this manner, a shunt circuit S having the capacitance $C_R$, the inductance $L_L$, and the open stub is formed between the first conductor 100 and the second conductor 200.

On the other hand, the ends of a first one of second conductors 200a and a second one of second conductors 200b are opposite to each other, and thus a capacitance $C_L$ is formed at this portion. In addition, the first one of the second conductors 200a has an inductance $L_R$. For this reason, a series circuit D having the capacitance $C_L$ and the inductance $L_R$ is formed between the first one of the second conductors 200a and the second one of the second conductors 200b.

Since the fourth conductor 300 forms a short stub using the second one of the second conductors 200b as a return path, the input impedance of the open stub is added to the series circuit D.

The leaky wave antenna according to the embodiment is preferably designed so as to satisfy so-called "balance conditions" in which the resonance frequencies of the shunt circuit S and the series circuit D are matched with each other. This is because it is known generally that impedance matching is difficult to be obtained due to a drastic change in the input impedance of an antenna in the vicinity of the above-mentioned resonance frequency, but the matching is easily performed due to a moderate change in the input impedance when the balance conditions are satisfied. In the embodiment, since the resonance frequency of the shunt circuit S can be controlled with the length of the open stub, and the resonance frequency of the series circuit D can be controlled with the length of the short stub, the design in which the balance conditions are satisfied is facilitated as compared to a structure in the related art. However, even when the balance conditions are not satisfied, the essential effect of the invention is not influenced at all thereby.

Figure 5:
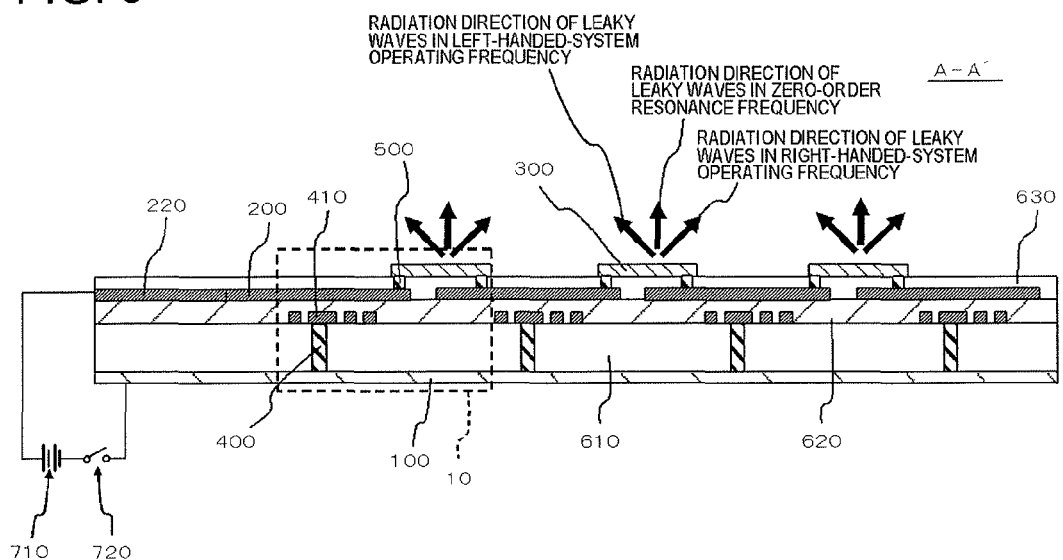
FIG. 5 is a diagram for explaining operations and effects of the embodiment.

Next, the operations and effects of the embodiment will be described with reference to FIG. 5. FIG. 5 is a diagram illustrating radiation directions of leaky waves when power is input from the power feed conductor 220 in the structure shown in FIGS. 1 to 3. In the structure according to the embodiment, it is known that zero-order resonance is caused in which the wavelengths of electromagnetic waves in the structure become infinite at the resonance frequency of the shunt circuit S or the resonance frequency of the series circuit D, and leaky waves are refracted and radiated in the direction perpendicular to the structure at the zero-order resonance frequency. In addition, the structure according to the embodiment operates as a left-handed system metamaterial at the frequency side lower than the zero-order resonance frequency, and has a value with a negative refractive index. For this reason, leaky waves are refracted and radiated backward with respect to the traveling direction of power.

On the other hand, since the structure according to the embodiment operates as a right-handed system metamaterial at the frequency side higher than the zero-order resonance frequency and has a value with a positive refractive index, leaky waves are refracted and radiated forward with respect to the traveling direction of power.

On the other hand, the insulating layer 620 is formed of a variable capacitance layer, and the dielectric constant thereof varies with the potential difference between the third conductor 410 and the second conductor 200, that is, the voltage applied between the first conductor 100 and the second conductor 200. For this reason, the voltage applied between the first conductor 100 and the second conductor 200 is changed, and thus it is possible to change the dielectric constant of the layer (insulating layer 620) between the third conductor 410 and the second conductor 200, that is, between the open stubs, and to, as a result, change the propagation constant of the transmission line formed by the third conductor 410. Thereby, it is possible to change the zero-order resonance frequency of the structure in a certain frequency domain. When the frequency which is input to the antenna is located in a variable range of the zero-order resonance frequency of the structure, it is possible to change the radiation direction of leaky waves.

That is, the voltage applied between the first conductor 100 and the second conductor 200 is changed, and thus the zero-order resonance frequency can be located at any of the frequency side higher than the frequency which is input to the antenna and the frequency side lower than that, and can also be matched to the frequency which is input to the antenna. When the zero-order resonance frequency is located at the frequency side higher than the frequency which is input to the antenna, leaky waves are refracted and radiated backward with respect to the traveling direction of power. In addition, when the zero-order resonance frequency is located at the frequency side lower than the frequency which is input to the antenna, leaky waves are refracted and radiated forward with respect to the traveling direction of power. Further, when the zero-order resonance frequency is matched to the frequency which is input to the antenna, leaky waves are refracted and radiated in the vertical direction with respect to the traveling direction of power.

In addition, the plurality of second conductors 200 are connected to each other through the fourth conductor 300 and the via 500 in a direct-current manner. For this reason, as shown in FIG. 5, a variable voltage source 710 of a direct current is connected between any of the second conductors 200 and the first conductor 100 through, for example, a switch 720, and thus the same voltage based on the first conductor 100 can be applied to all the second conductors 200. Therefore, the interconnect structure is simplified.

Figure 6:
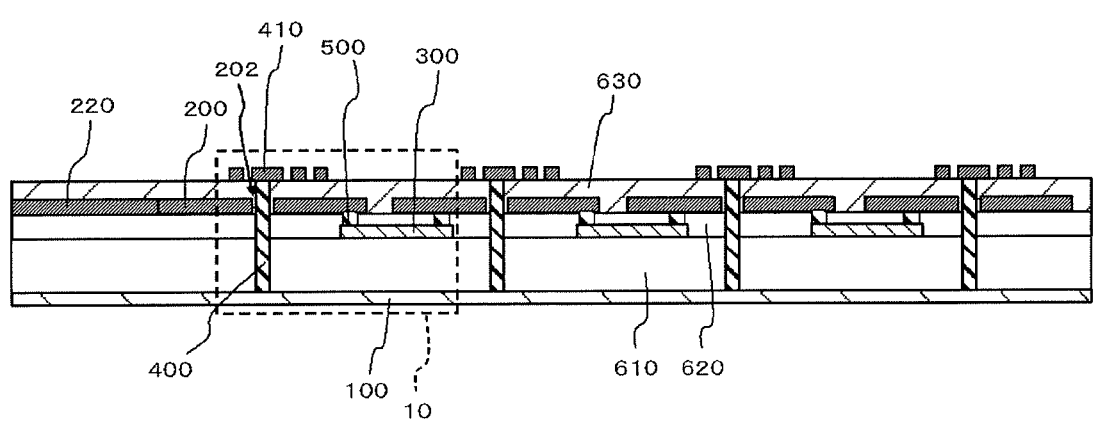
FIG. 6 is a sectional view illustrating a configuration of a structure according to a second embodiment.

FIG. 6 is a sectional view illustrating a configuration of a structure according to a second embodiment, and is equivalent to FIG. 2 in the first embodiment. The structure according to the embodiment has the same configuration as the structure according to the first embodiment, except for the following points.

First, the layer on which the third conductor 410 is formed and the layer on which the fourth conductor 300 is formed are replaced with each other. That is, the third conductor 410 is formed on the insulating layer 630, and the fourth conductor 300 is formed on the insulating layer 610. That is, in the embodiment, the second conductor 200 is located at the opposite side to the first conductor 100 through the fourth conductor 300, and the third conductor 410 is located at the opposite side to the fourth conductor 300 through the second conductor 200. The via 500 is provided within the insulating layer 620.

In addition, the second conductor 200 has an aperture 202, and the via 400 passes through the insulating layers 610, 620, and 630 through the aperture 202. For this reason, the via 400 can be connected to the third conductor 410 without electrical conduction with the second conductor 200.

In addition, the insulating layer 630 is formed of a variable dielectric constant layer, but the insulating layer 620 is not formed thereof. That is, the insulating layer 630 is formed of a material, such as a liquid crystal, of which the dielectric constant varies with a voltage.

In the embodiment, the same effect as that of the first embodiment can also be obtained.

Figure 7:
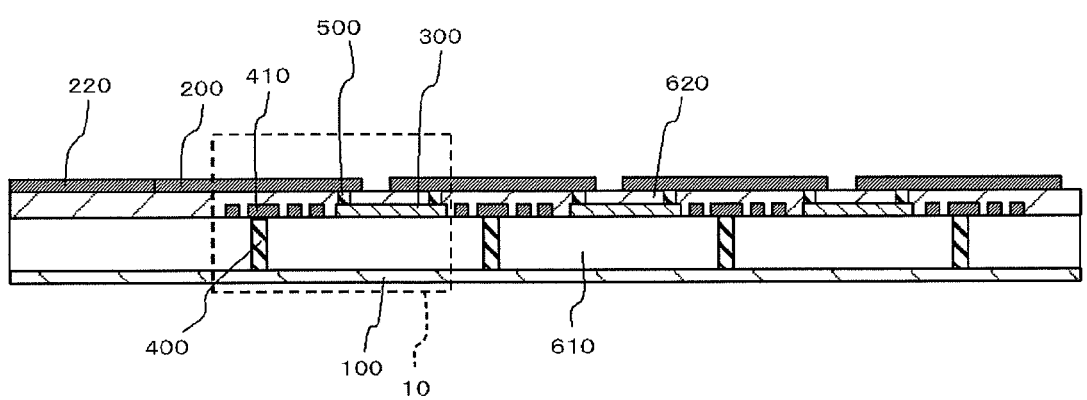
FIG. 7 is a sectional view illustrating a configuration of a structure according to a third embodiment.

FIG. 7 is a sectional view illustrating a configuration of a structure according to a third embodiment, and is equivalent to FIG. 2 in the first embodiment. The structure according to the embodiment has the same configuration as the structure according to the first embodiment, except for the following points.

First, the fourth conductor 300 is formed on the same layer as the third conductor 410, that is, on the insulating layer 610. In addition, the via 500 is formed within the insulating layer 620. The insulating layer 630 is not formed.

In the embodiment, the same effect as that of the first embodiment can also be obtained. In addition, since it is not necessary to provide the insulating layer 630, the number of layers can be reduced. In addition, since the layer between the fourth conductor 300 and the second conductor 200 is also formed of a variable dielectric constant layer, the propagation constant of the short stub in the series circuit D can be changed as well. Thereby, it is possible to change the zero-order resonance frequency while the balance conditions are satisfied, that is, while impedance matching is maintained.

Figure 8:
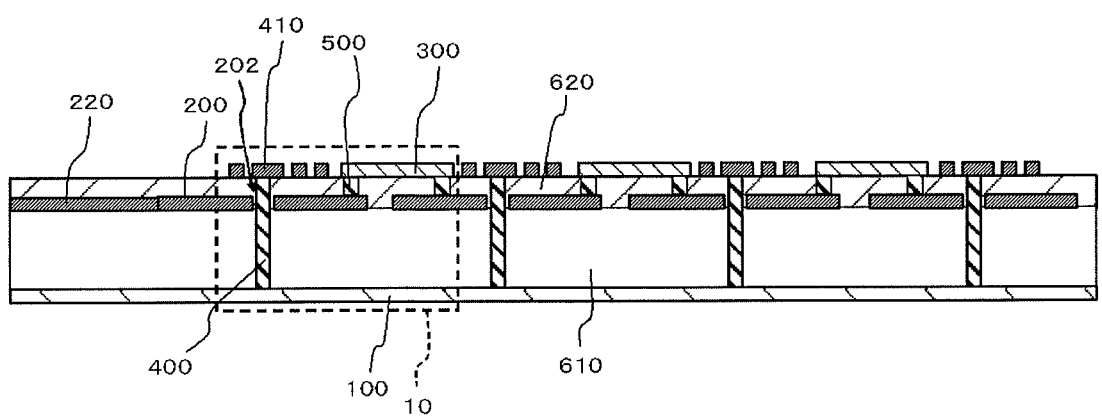
FIG. 8 is a sectional view illustrating a configuration of a structure according to a fourth embodiment.

FIG. 8 is a sectional view illustrating a configuration of a structure according to a fourth embodiment, and is equivalent to FIG. 7 in the third embodiment. The structure according to the embodiment has the same configuration as the structure according to the third embodiment, except that the layer on which the second conductor 200 and the power feed conductors 220 and 240 are formed and the layer on which the third conductor 410 and the fourth conductor 300 are formed are replaced with each other.

That is, the second conductor 200 and the power feed conductors 220 and 240 are formed on the insulating layer 610. The third conductor 410 and the fourth conductor 300 are formed on the insulating layer 620. The insulating layer 630 is not formed.

In addition, the second conductor 200 has the aperture 202, and the via 400 passes through the insulating layers 610 and 620 through the aperture 202. For this reason, the via 400 can be connected to the third conductor 410 without electrical conduction with the second conductor 200.

In the embodiment, the same effect as that of the third embodiment can also be obtained.

Figure 9:
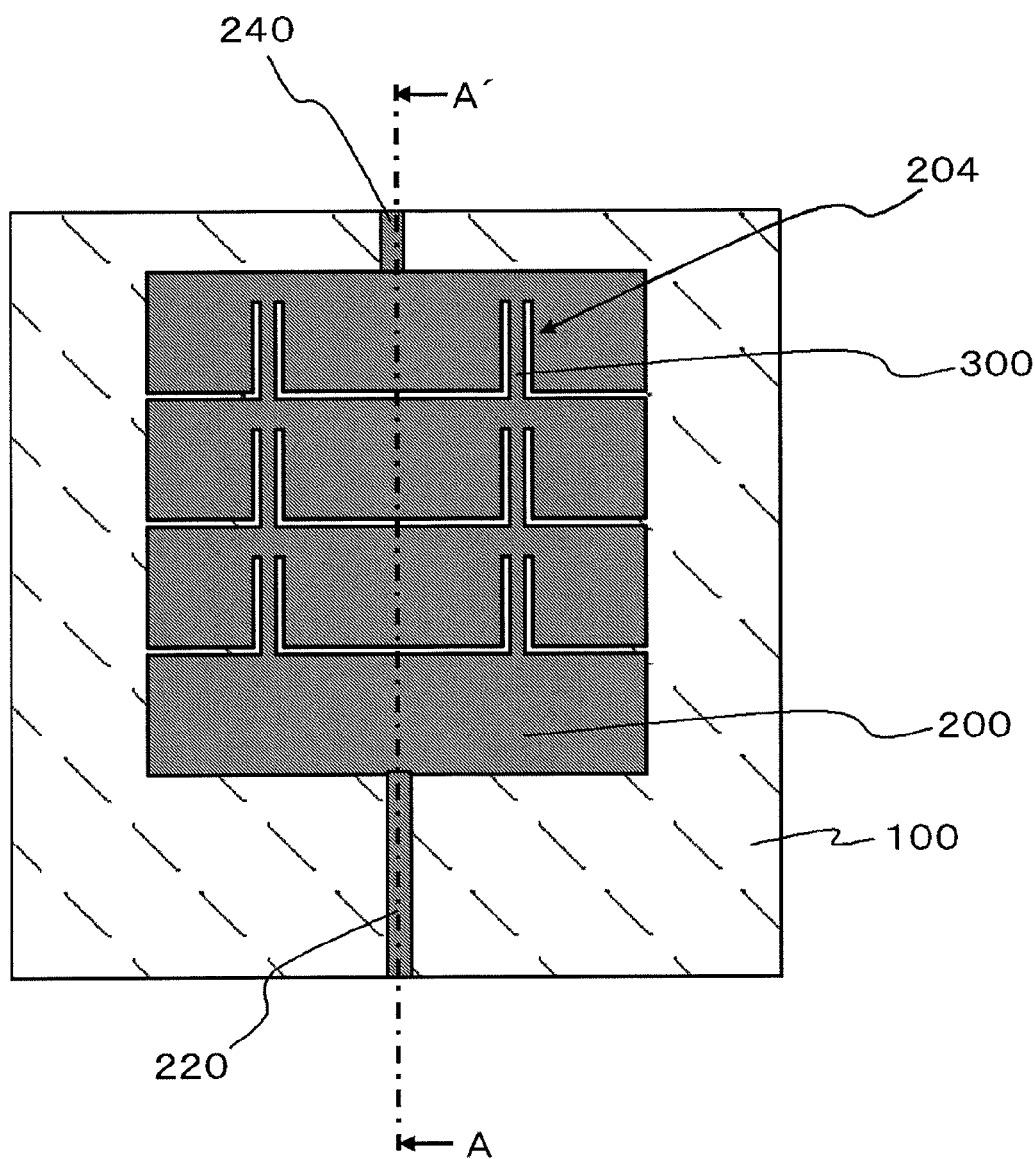
FIG. 9 is a plan view illustrating a configuration of a structure according to a fifth embodiment.
Figure 10:
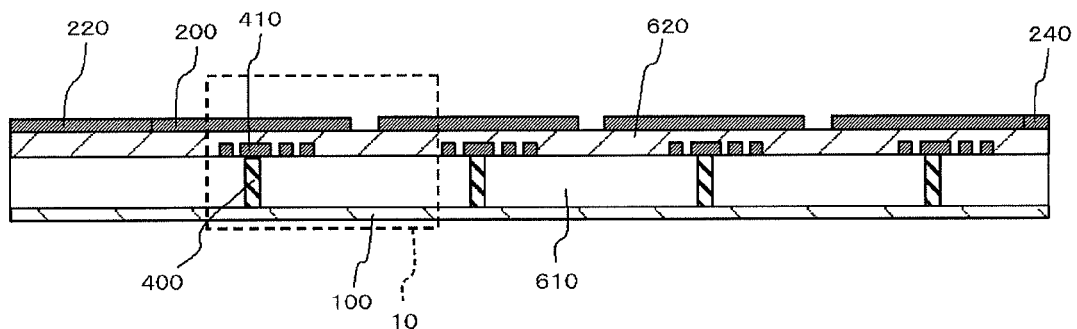
FIG. 10 is a sectional view taken along the line A-A' of FIG. 9.

FIG. 9 is a plan view illustrating a configuration of a structure according to a fifth embodiment. FIG. 10 is a sectional view taken along the line A-A' of FIG. 9. The structure according to the embodiment has the same configuration as the structure according to the first embodiment, except for the following points.

First, the fourth conductor 300 is formed on the same layer as the second conductor 200, that is, on the insulating layer 620. In addition, the via 500 and the insulating layer 630 are not formed.

Specifically, the plurality of second conductors 200 include a concave portion 204, except for the second conductor 200 connected to the power feed conductor 220. The second conductor 200 is rectangular in shape, and the concave portion 204 is formed at the side which is close to the power feed conductor 220 in the second conductor 200. The fourth conductor 300 is formed integrally with the second conductor 200, and is connected to the bottom of the concave portion 204 of the second conductor 200 located next thereto, from the side which is far from the power feed conductor 220 in the second conductor 200. That is, the fourth conductor 300 forms a coplanar line using the lateral side of the concave portion 204 as a return path, and functions as a short stub.

Meanwhile, the second conductor 200 of FIG. 9 includes a concave portion in one side opposite to the second conductor 200 adjacent thereto and the fourth conductor 300 in the other side, but is not required to be limited to the configuration of FIG. 9, insofar as a concave portion is provided at one side in the sides of which a set of second conductors 200 located next to each other are opposite to each other, the fourth conductor 300 is provided at the other side, and a coplanar line is formed. For example, in the example shown in FIG. 9, the position in which the concave portion 204 is formed and the position in which the fourth conductor 300 is formed may be replaced with each other, and the second conductor 200 may be provided with the concave portion on both sides, or the second conductor 200 may be provided with the fourth conductor 300 on both sides.

In the embodiment, the same effect as that of the first embodiment can also be obtained. In addition, since the fourth conductor 300 is formed on the same layer as the second conductor 200, the via 500 and the insulating layer 630 are not required to be formed, and the number of layers required for the structure can be reduced. Therefore, manufacturing costs of the structure can be further reduced.

Figure 11:
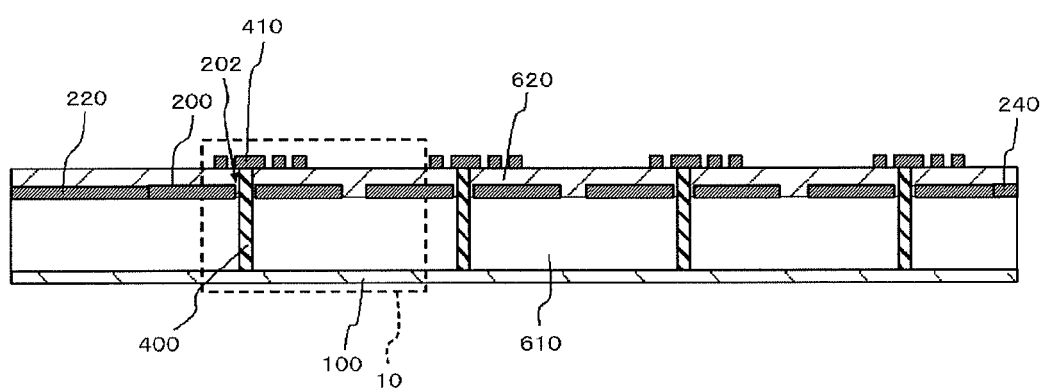
FIG. 11 is a sectional view illustrating a configuration of a structure according to a sixth embodiment.

FIG. 11 is a sectional view illustrating a configuration of a structure according to a sixth embodiment, and is equivalent to FIG. 10 in the fifth embodiment. The structure according to the embodiment has the same configuration as the structure according to the fifth embodiment, except that the layer on which the second conductor 200 and the fourth conductor 300 (not shown in the drawing) are formed and the layer on which the third conductor 410 is formed are replaced with each other.

Specifically, the second conductor 200 and the fourth conductor 300 are formed on the insulating layer 610, and the third conductor 410 is formed on the insulating layer 620. In addition, the second conductor 200 includes the aperture 202, and the via 400 passes through the insulating layers 610 and 620 through the aperture 202. For this reason, the via 400 can be connected to the third conductor 410 without electrical conduction with the second conductor 200.

In the embodiment, the same effect as that of the fifth embodiment can also be obtained.

Figure 12:
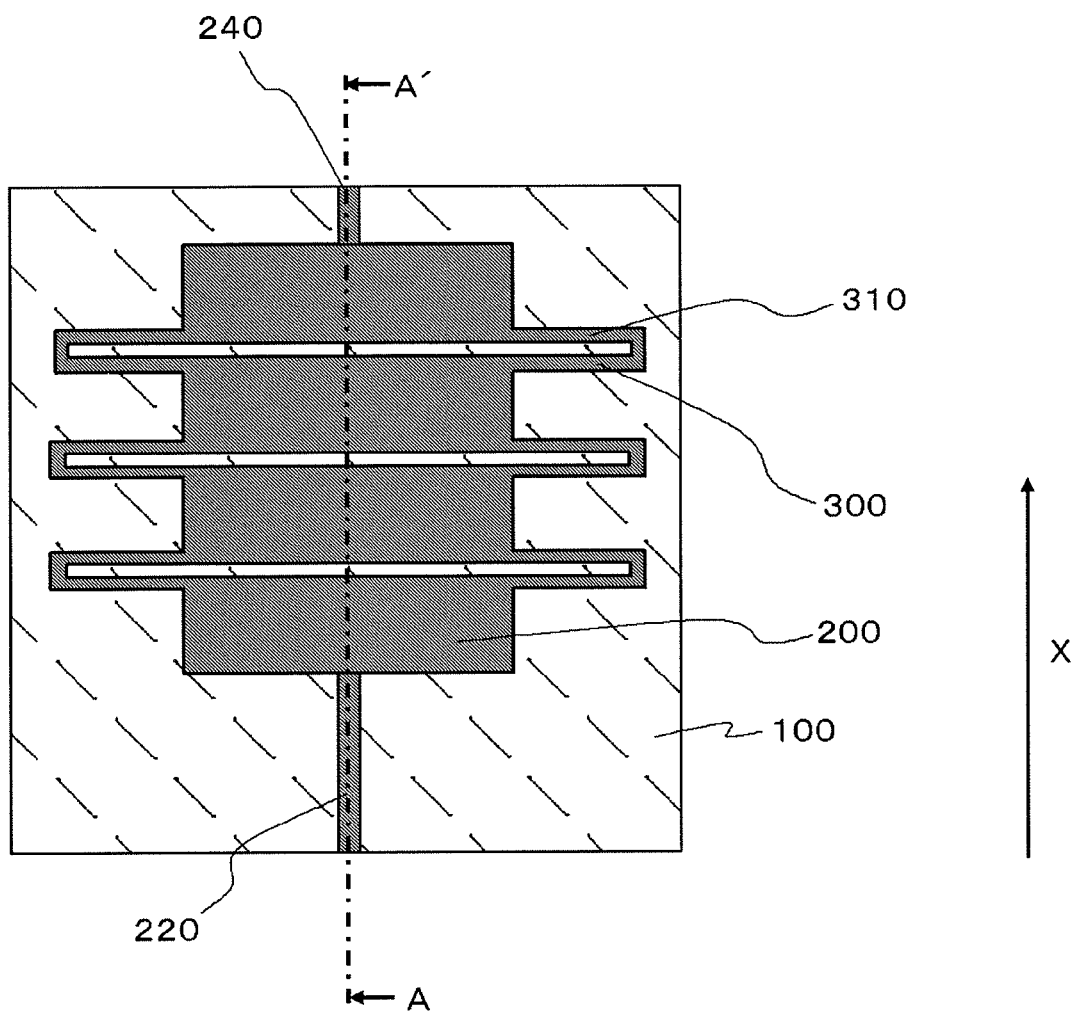
FIG. 12 is a plan view illustrating a configuration of a structure according to a seventh embodiment.

FIG. 12 is a plan view illustrating a configuration of a structure according to a seventh embodiment. The structure according to the embodiment has the same configuration as the structure according to the fifth embodiment, except for the following points.

First, the second conductor 200 does not include the concave portion 204. In addition, the second conductor 200 is lined up in the X direction in the drawing. The fourth conductor 300 extends in the direction intersecting the X direction in the drawing, from the side which is opposite to the second one of the second conductors in the first one of the second conductors 200.

Specifically, the second conductor 200 is rectangular in shape. The fourth conductor 300 is formed integrally with the second conductor 200 at the side which is far from the power feed conductor 220 in the second conductor 200. The fourth conductor 300 extends in the direction substantially parallel to the above-mentioned side of the second conductor 200, that is, in the direction perpendicular to the X direction.

In addition, the second conductor 200 includes a fifth conductor 310 at the side close to the power feed conductor 220. The fifth conductor 310 extends opposite to the fourth conductor 300 of the second conductor 200 located next thereto, and a balanced-type transmission line is formed by the fourth conductor 300 and the fifth conductor 310. It is preferable that the fourth conductor 300 and the fifth conductor 310 be parallel to each other and have the same length. The ends of the fourth conductor 300 and the fifth conductor 310 are connected to each other, and the balanced-type transmission line formed by these conductors functions as a short stub.

In the embodiment, the same effect as that of the fifth embodiment can also be obtained.

Figure 13:
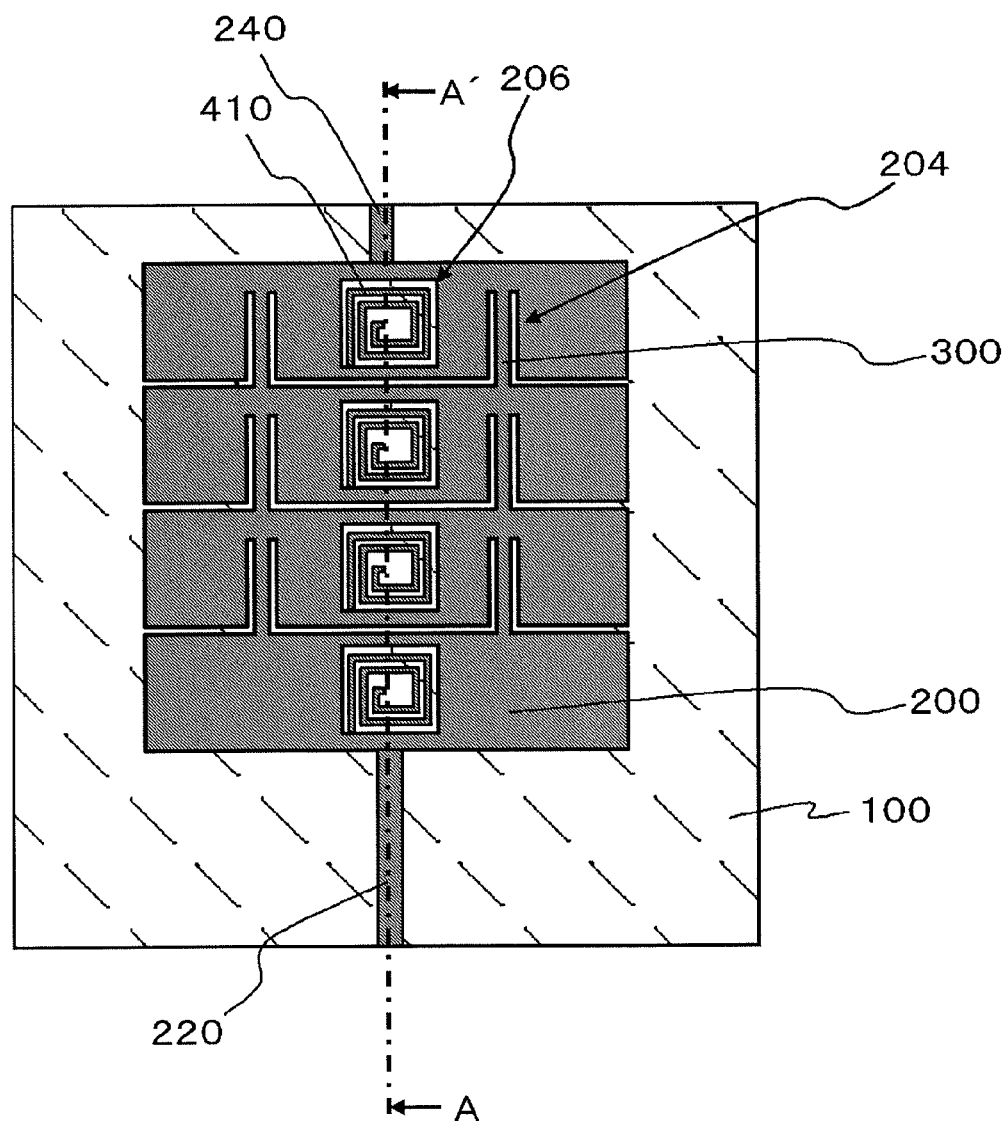
FIG. 13 is a plan view illustrating a configuration of a structure according to an eighth embodiment.
Figure 14:
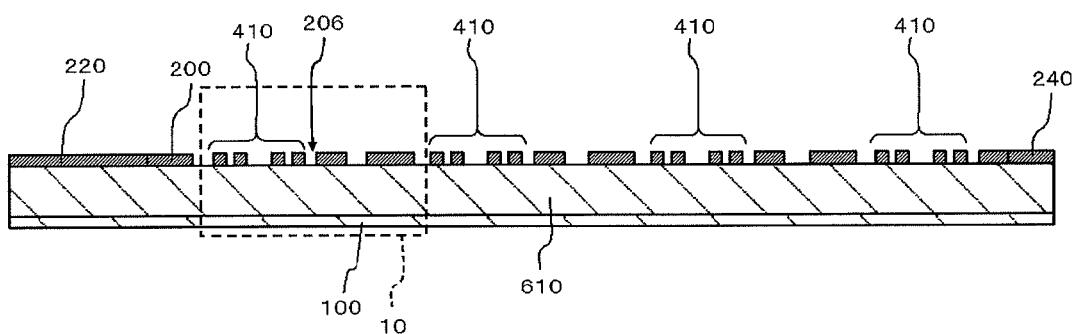
FIG. 14 is a sectional view taken along the line A-A' of FIG. 13.

FIG. 13 is a plan view illustrating a configuration of a structure according to an eighth embodiment. FIG. 14 is a sectional view taken along the line A-A' of FIG. 13. The structure according to the embodiment has the same configuration as the structure according to the fifth embodiment, except for the following points.

First, the second conductor 200 is provided with an aperture 206. The third conductor 410 is formed within the aperture 206. That is, the third conductor 410 is formed on the same layer as the second conductor 200 and the fourth conductor 300, and is opposite to the first conductor 100. The third conductor 410 is configured such that one end thereof is connected to the second conductor 200 at the edge of the aperture 206, and the other end thereof is an open end. That is, the third conductor 410 forms a microstrip line using the first conductor 100 as a return path, and functions as an open stub.

In addition, the insulating layer 610 is formed of a variable dielectric constant layer. The via 400 and the insulating layer 620 are not provided.

Figure 15:
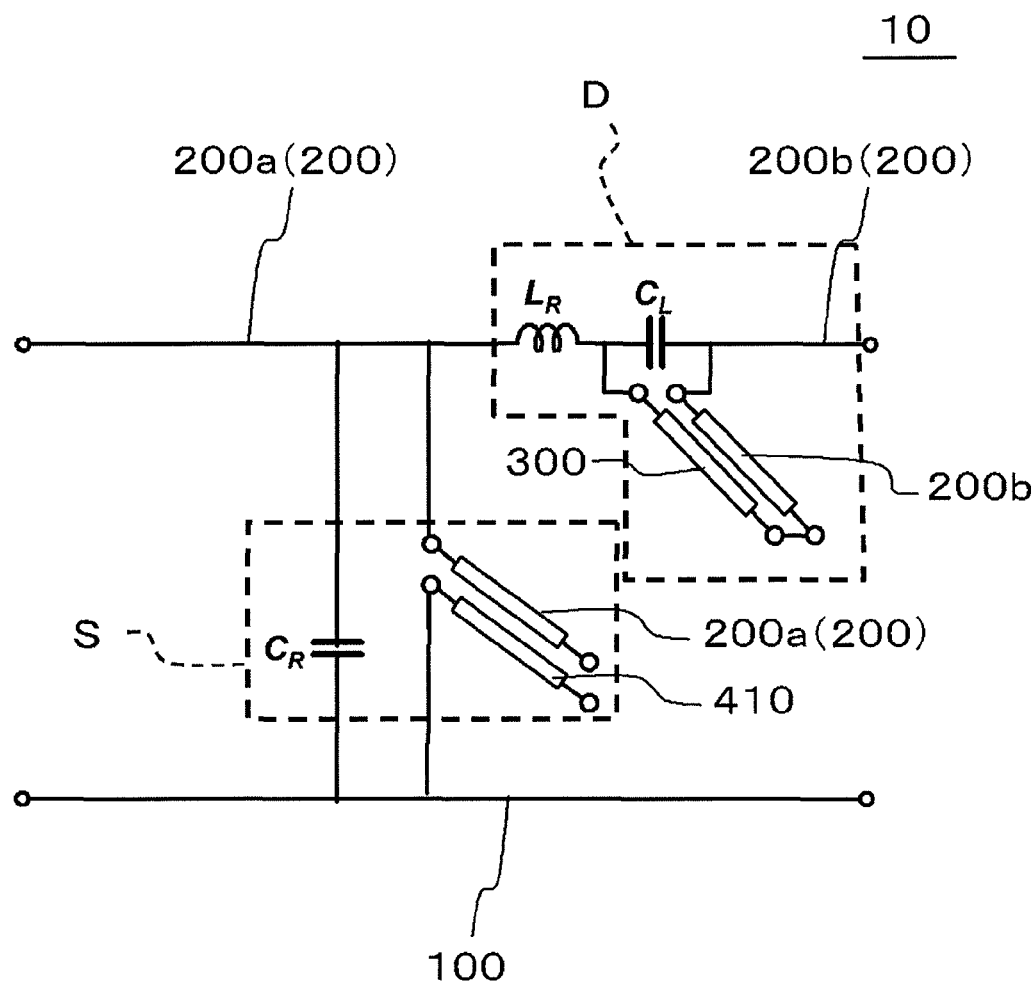
FIG. 15 is an equivalent circuit diagram of a unit cell of the structure shown in FIGS. 13 and 14.

FIG. 15 is an equivalent circuit diagram of the unit cell 10 of the structure shown in FIGS. 13 and 14. The equivalent circuit shown in the drawing is the same as the equivalent circuit of the unit cell 10 shown in FIG. 4, that is, the equivalent circuit of the unit cell 10 according to the first embodiment and the unit cell 10 according to the fifth embodiment, except that the inductance $L_L$ derived from the via 400 is not included.

In the embodiment, the same effect as that of the first embodiment can also be obtained. In addition, since the structure can be formed using two interconnect layers and one insulating layer 610, it is possible to reduce manufacturing costs of the structure. In addition, since the layer between the second conductor 200 and the first conductor 100 is also formed of a variable dielectric constant layer, it is possible to change the propagation constant of the short stub in the series circuit D. Thereby, it is possible to change the zero-order resonance frequency while the balance conditions are satisfied, that is, while impedance matching is maintained.

Figure 16:
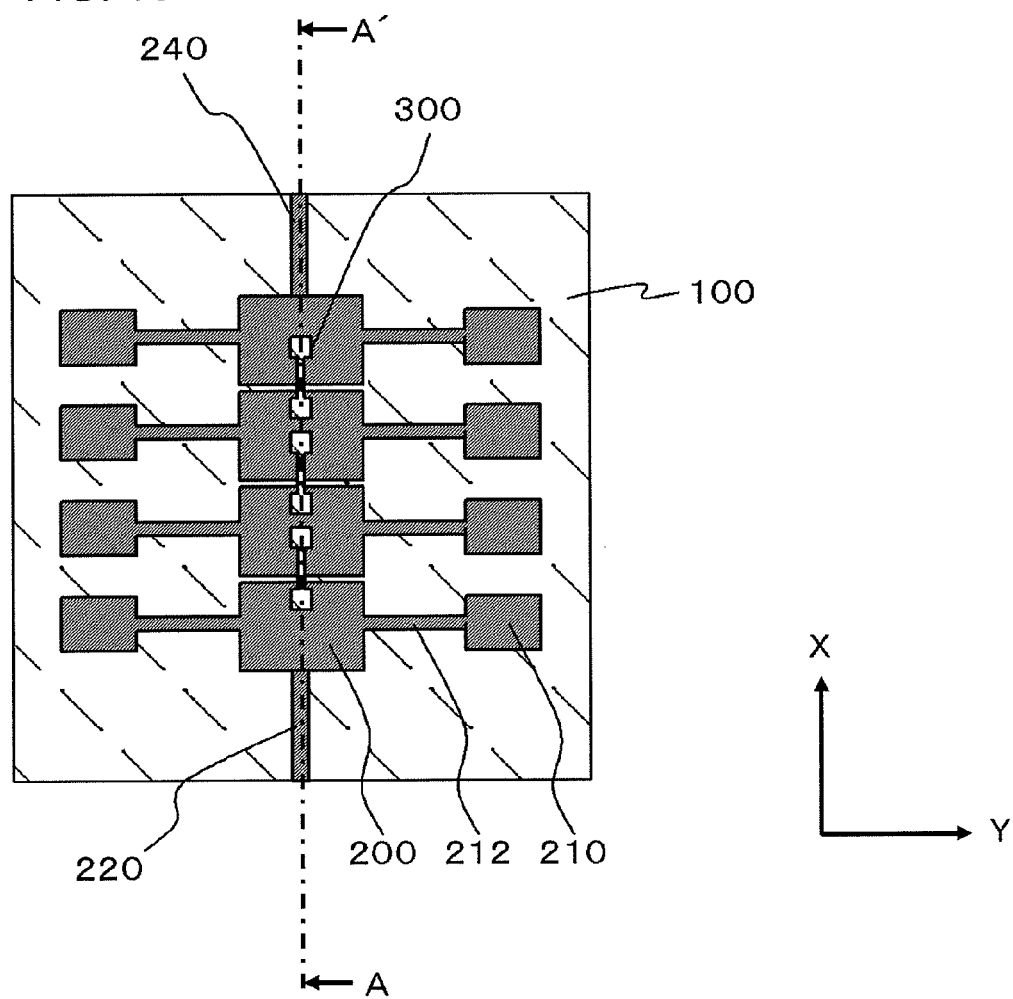
FIG. 16 is a plan view illustrating a configuration of a structure according to a ninth embodiment.
Figure 17:
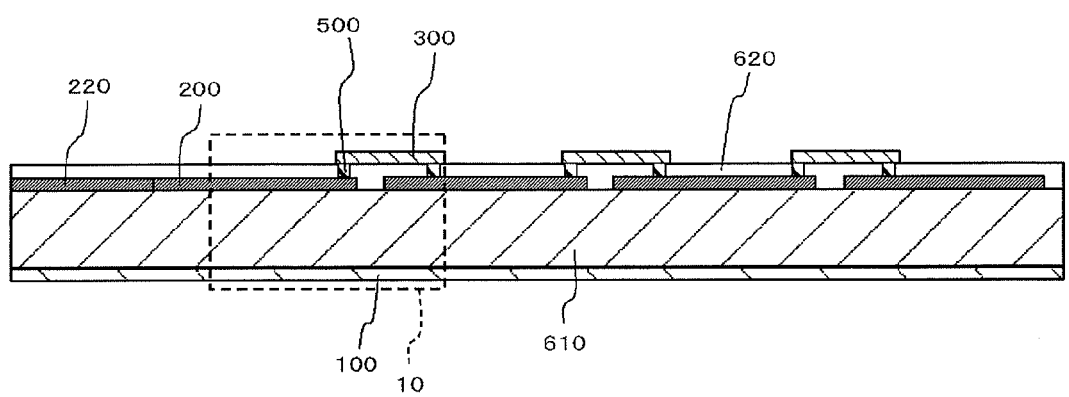
FIG. 17 is a sectional view taken along the line A-A' of FIG. 16.

FIG. 16 is a plan view illustrating a configuration of a structure according to a ninth embodiment. FIG. 17 is a sectional view taken along the line A-A' of FIG. 16. The structure according to the embodiment has the same configuration as the structure according to the first embodiment, except for the following points.

First, the second conductor 200 and the power feed conductors 220 and 240 are formed on the insulating layer 610. The third conductor 210 is included instead of the third conductor 410, and an inductance element 212 is included instead of the via 400. The third conductor 210 and the inductance element 212 are formed on the same layer as the second conductor 200, that is, on the first conductor 610. The third conductors 210 are arranged side by side with the second conductor 200 in the Y direction in the drawing, that is, in the direction perpendicular to the array direction of the second conductors 200. In the example shown in the drawings, the third conductor 210 is arranged at both sides of the second conductor 200. The inductance element 212 is an interconnect-shaped conductor pattern, and connects the second conductor 200 and the third conductor 210.

In addition, the fourth conductor 300 is formed on the insulating layer 620, and the via 500 is formed within the insulating layer 620. The insulating layer 610 is formed of a variable dielectric constant layer, but the insulating layer 620 is not formed thereof. The insulating layer 630 is not formed.

Figure 18:
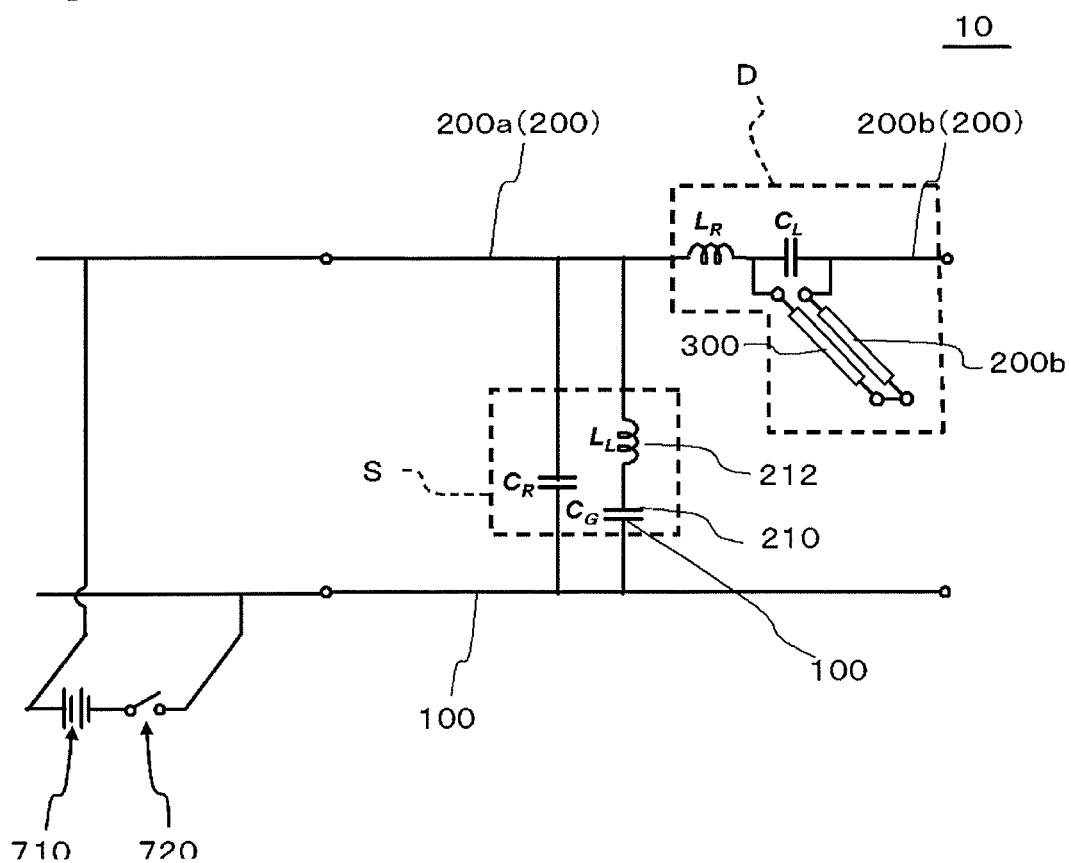
FIG. 18 is an equivalent circuit diagram of a unit cell of the structure shown in FIGS. 16 and 17.

FIG. 18 is an equivalent circuit diagram of the unit cell 10 of the structure shown in FIGS. 16 and 17. As shown in the drawing, the unit cell 10 in the embodiment is the same as the equivalent circuit shown in FIG. 4, except that the shunt circuit S has a capacitance $C_G$ instead of the short stub. The capacitance $C_G$ is a capacitance formed between the first conductor 100 and the third conductor 210, and is located between the inductance $L_L$ caused by the inductance element 212 and the first conductor 100 in the equivalent circuit.

In the embodiment, the voltage applied between the first conductor 100 and the second conductor 200 is changed, and thus it is possible to change the dielectric constant of the dielectric layer (insulating layer 610) of the capacitance $C_G$ formed by the third conductor 210 and the first conductor 100 and the dielectric constant of the dielectric layer (insulating layer 610) of the capacitance $C_R$ formed by the first conductor 100 and the second conductor 200. As a result, it is possible to change the propagation constant of the shunt circuit S. Therefore, the same effect as that of the first embodiment can be obtained.

Figure 19:
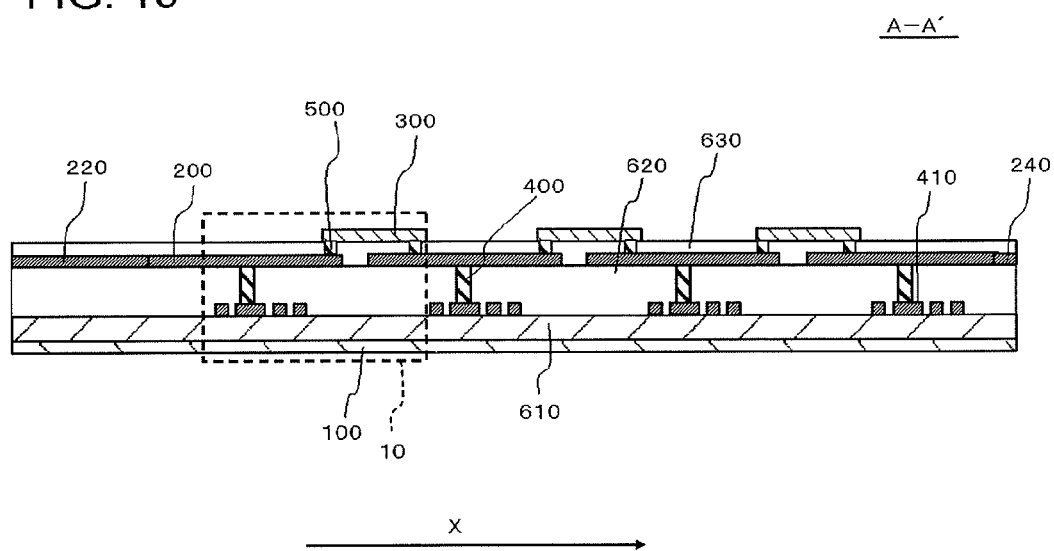
FIG. 19 is a sectional view illustrating a configuration of a structure according to a tenth embodiment.

FIG. 19 is a sectional view illustrating a configuration of a structure according to a tenth embodiment, and corresponds to FIG. 2 in the first embodiment. The structure according to the embodiment has the same configuration as the structure according to the first embodiment, except for the following points.

First, the via 400 connects the third conductor 410 not to the first conductor 100, but to the second conductor 200. For this reason, the return path of the third conductor 410 is not formed of the second conductor 200, but formed of the first conductor 100. The insulating layer 610 is formed of a variable dielectric constant material, but the insulating layer 620 is not formed thereof.

In the embodiment, the same effect as that of the first embodiment can also be obtained.

The embodiments of the invention have been described above with reference to the drawings. However, these are exemplification of the invention and various configurations other than those described above can also be adopted. For example, in the first to sixth embodiments, the insulating layer 610 may be formed of a variable dielectric constant layer. Further, in the second embodiment, the insulating layer 620 may be formed of a variable dielectric constant layer.

The application claims priority from Japanese Patent Application No. 2010-127199 filed on Jun. 2, 2010, the content of which is incorporated herein by reference in its entirety.

The invention claimed is:

1. A structure comprising:
a first conductor;
a plurality of second conductors, opposite to the first conductor, which are repeatedly arranged;
a plurality of third conductors opposite to the respective plurality of second conductors;
a variable dielectric constant layer, provided at least one of between the plurality of third conductors and the plurality of second conductors and between the plurality of third conductors and the first conductor, of which a dielectric constant varies with a voltage; and a fourth conductor that connects a first one of the second conductors and a second one of the second conductors located next to the first one of the second conductors to each other.

2. The structure according to claim 1, wherein the fourth conductor forms a transmission line using the second one of the second conductors as a return path.

3. The structure according to claim 2, wherein the transmission line is a microstrip line.

4. The structure according to claim 2, wherein the transmission line is a coplanar line.

5. The structure according to claim 2, wherein the transmission line is a balanced-type transmission line.

6. The structure according to claim 1, wherein three or more second conductors and third conductors are provided, and the fourth conductor is provided between all the second conductors located next to each other.

7. The structure according to claim 1, wherein the variable dielectric constant layer is provided between at least the plurality of third conductors and the plurality of second conductors, and
the third conductors form a transmission line using the second conductor as a return path.

8. The structure according to claim 7, further comprising an inductance element, provided at least one by one to each of the plurality of third conductors, which connects the first conductor and the third conductor.

9. The structure according to claim 1, wherein the variable dielectric constant layer is provided at least between the plurality of third conductors and the first conductor, and
the third conductors form a transmission line using the first conductor as a return path.

10. The structure according to claim 9, further comprising an inductance element, provided at least one by one to each of the plurality of third conductors, which connects the second conductor and the third conductor.

11. The structure according to claim 1, wherein the second conductor is located at the opposite side to the first conductor through the third conductor, and
the fourth conductor is located at the opposite side to the third conductor through the second conductor.

12. The structure according to claim 1, wherein the second conductor is located at the opposite side to the first conductor through the fourth conductor, and
the third conductor is located at the opposite side to the fourth conductor through the second conductor.

13. The structure according to claim 1, wherein the fourth conductor is formed on the same layer as the third conductor.

14. The structure according to claim 1, wherein the fourth conductor is formed on the same layer as the second conductor,
the second one of the second conductors includes a concave portion at a side which is opposite to the first one of the second conductors, and
the fourth conductor extends from the first one of the second conductors to an inner side of the concave portion.

15. The structure according to claim 14, wherein the first one of the second conductors and the second one of the second conductors are lined up in a first direction, and the fourth conductor extends in a direction intersecting the first direction from a side which is opposite to the second one of the second conductors in the first one of the second conductors.

16. The structure according to claim 1, wherein the third conductor is formed on the same layer as the second conductor.

17. The structure according to claim 1, wherein the third conductor forms a capacitance between the first conductor and the third conductor.

18. The structure according to claim 1, wherein the structure is at least a portion of an antenna, and
the structure further comprises a power feed conductor line which is connected to the first conductor and the third conductor located at an end.

* * * * *

UNITED STATES PATENT AND TRADEMARK OFFICE
CERTIFICATE OF CORRECTION

| | | |
|---|---|---|
| PATENT NO. | : 8,922,455 B2 | Page 1 of 1 |
| APPLICATION NO. | : 13/700960 | |
| DATED | : December 30, 2014 | |
| INVENTOR(S) | : Hiroshi Toyao and Noriaki Ando | |

It is certified that error appears in the above-identified patent and that said Letters Patent is hereby corrected as shown below:

On the Title Page, item 54, and in the Specification, col. 1, line 1 - Title: Delete "STRUCTURE" and insert -- A Simple Interconnect Structure --

On the Title Page, item 73 - Assignee: Delete "Toyko" and insert -- Tokyo --

Signed and Sealed this
Twenty-fifth Day of August, 2015

Michelle K. Lee
*Director of the United States Patent and Trademark Office*